United States Patent
Mao et al.

(10) Patent No.: US 12,314,501 B2
(45) Date of Patent: May 27, 2025

(54) OPERATION METHOD OF ELECTRONIC DEVICE FOR SENSING OPTICAL SIGNAL AND ELECTRONIC DEVICE

(71) Applicant: InnoLux Corporation, Miao-Li County (TW)

(72) Inventors: Li-Wei Mao, Miao-Li County (TW); Chin-Lung Ting, Miao-Li County (TW); Ker-Yih Kao, Miao-Li County (TW); Ming-Chun Tseng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/330,605

(22) Filed: Jun. 7, 2023

(65) Prior Publication Data
US 2023/0325036 A1 Oct. 12, 2023

Related U.S. Application Data (62) Division of application No. 17/210,914, filed on Mar. 24, 2021, now Pat. No. 11,709,569.

(30) Foreign Application Priority Data

Apr. 13, 2020 (CN) .......................... 202010284110.0

(51) Int. Cl.
*G06F 3/042* (2006.01)
*G06F 3/041* (2006.01)
(Continued)

(52) U.S. Cl.
CPC .......... *G06F 3/0412* (2013.01); *G06F 3/0416* (2013.01); *G06F 3/04166* (2019.05);
(Continued)

(58) Field of Classification Search
CPC .. G06F 3/0412; G06F 3/0416; G06F 3/04166; G06F 3/0418; G06F 3/0421;
(Continued)

(56) References Cited

U.S. PATENT DOCUMENTS 9,000,452 B2 * 4/2015 Kung ................ H01L 31/02162
257/E33.077
11,341,763 B2 5/2022 Kim
(Continued)

FOREIGN PATENT DOCUMENTS

CN 1922470 A 2/2007
CN 107871447 A 4/2018
(Continued)

*Primary Examiner* — Julie Anne Watko
(74) *Attorney, Agent, or Firm* — McClure, Qualey & Rodack, LLP (57) ABSTRACT

An operation method of an electronic device for sensing an optical signal is provided. The electronic device includes a plurality of optical sensors and a plurality of light-emitting elements disposed adjacent to the plurality of optical sensors. The operation method of the electronic device for sensing the optical signal includes the following steps. The optical signal is provided to a first optical sensor of the plurality of optical sensors. The first optical sensor outputs a driving signal when dimming the plurality of light-emitting elements adjacent to the first optical sensor. Therefore, the accuracy of sensing the optical signal may be effectively increased.

15 Claims, 6 Drawing Sheets

(51) Int. Cl.
*G09G 3/20* (2006.01)
*G09G 3/22* (2006.01)
*G09G 3/32* (2016.01)
*H10K 59/126* (2023.01)
*G09G 3/3208* (2016.01)

(52) U.S. Cl.
CPC ......... *G06F 3/0421* (2013.01); *G09G 3/2007* (2013.01); *H10K 59/126* (2023.02); *G09G 3/2003* (2013.01); *G09G 3/32* (2013.01); *G09G 3/3208* (2013.01); *G09G 2300/0426* (2013.01); *G09G 2360/145* (2013.01); *G09G 2360/148* (2013.01)

(58) Field of Classification Search
CPC ...... G09G 3/2003; G09G 3/2007; G09G 3/32; G09G 3/3208; G09G 2300/0426; G09G 2360/145; G09G 2360/148; H10K 59/126
See application file for complete search history.

(56) References Cited

U.S. PATENT DOCUMENTS

| | | | | |
|---|---|---|---|---|
| 11,587,482 B2 * | 2/2023 | Han | | H10K 59/65 |
| 2009/0256810 A1 * | 10/2009 | Pasquariello | | G06F 3/0421 345/173 |
| 2015/0234540 A1 * | 8/2015 | Sasaki | | A61B 6/46 345/175 |
| 2017/0161543 A1 * | 6/2017 | Smith | | G02F 1/13338 |
| 2018/0101271 A1 * | 4/2018 | Tsai | | G06F 3/0412 |
| 2019/0130155 A1 * | 5/2019 | Park | | G09G 3/32 |
| 2020/0184179 A1 * | 6/2020 | Hai | | G06V 10/145 |
| 2020/0311369 A1 * | 10/2020 | Lius | | G06V 40/1318 |
| 2020/0401269 A1 * | 12/2020 | Reynolds | | G06V 40/1359 |
| 2021/0066669 A1 * | 3/2021 | Kubota | | H10K 59/121 |
| 2021/0210557 A1 * | 7/2021 | Lim | | H10K 59/12 |
| 2021/0318777 A1 * | 10/2021 | Mao | | G06F 3/04166 |
| 2022/0165085 A1 * | 5/2022 | Xiong | | H10K 59/878 |
| 2022/0246695 A1 * | 8/2022 | Liu | | G06V 10/141 |
| 2023/0217595 A1 * | 7/2023 | Tsai | | H05K 1/181 361/760 |
| 2023/0354643 A1 * | 11/2023 | Sato | | H10K 59/1213 |
| 2023/0361141 A1 * | 11/2023 | Park | | H01L 27/14627 |
| 2024/0138169 A1 * | 4/2024 | Kusunoki | | G09G 3/32 |
| 2024/0237374 A9 * | 7/2024 | Godo | | G06F 3/013 |

FOREIGN PATENT DOCUMENTS

| | | | | |
|---|---|---|---|---|
| CN | 112379794 A | * | 2/2021 | ............ G06F 3/0412 |
| CN | 116745835 A | * | 9/2023 | ............. G06F 3/041 |
| CN | 111898397 B | * | 4/2024 | ......... G06V 40/1318 |
| WO | WO-2022160087 A1 | * | 8/2022 | ............ G06F 3/0412 |

* cited by examiner

OPERATION METHOD OF ELECTRONIC DEVICE FOR SENSING OPTICAL SIGNAL AND ELECTRONIC DEVICE

CROSS REFERENCE TO RELATED APPLICATIONS

This application is a Divisional of U.S. patent application Ser. No. 17/210,914, filed Mar. 24, 2021, which claims priority of China Patent Application No. 202010284110.0, filed on Apr. 13, 2020, the entirety of which is incorporated by reference herein.

CROSS REFERENCE TO RELATED APPLICATIONS

Field of the Disclosure

The present disclosure relates to an operation method, and in particular it relates to an operation method of an electronic device for sensing an optical signal and an electronic device.

DESCRIPTION OF THE RELATED ART

A conventional electronic device may sense light generated by a laser pen, or the reflected light generated by a finger touching an electronic device through an optical sensor, in order to determine the position of the laser pen or the finger on the electronic device. However, since the proper operation of the optical sensor may be affected by ambient light or light with a corresponding brightness that is generated by the light-emitting element of the electronic device, the accuracy of sensing the optical signal may be decreased. Therefore, a new driving design is needed to solve the above problem.

BRIEF SUMMARY OF THE DISCLOSURE

An embodiment of the disclosure provides an operation method of an electronic device for sensing an optical signal. The electronic device includes a plurality of optical sensors and a plurality of light-emitting elements disposed adjacent to the plurality of optical sensors. The operation method of the electronic device for sensing the optical signal includes the following steps. The optical signal is provided to a first optical sensor of the plurality of optical sensors. The first optical sensor outputs a driving signal when dimming the plurality of light-emitting elements adjacent to the first optical sensor.

In addition, an embodiment of the disclosure provides an operation method for sensing an optical signal, which includes the following steps. An electronic device is provided, wherein the electronic device includes a plurality of optical sensors and a plurality of light-emitting elements. The plurality of light-emitting elements emit a first optical signal, wherein the first optical signal has a first gray level. The plurality of light-emitting elements emitting a second optical signal, wherein the second optical signal has a second gray level, and the second gray level and the first gray level are different. An object is provided, wherein the object reflects the second optical signal to form a third optical signal. A first optical sensor of the plurality of optical sensors outputs a driving signal according to the third optical signal.

In addition, an embodiment of the disclosure provides an electronic device, which includes a substrate, a first light-emitting element, a second light-emitting element and an optical sensor. The first light-emitting element is disposed on the substrate. The second light-emitting element is disposed on the substrate, and the first light-emitting element is adjacent to the second light-emitting element. The optical sensor is disposed on the substrate, and the optical sensor is adjacent to the first light-emitting element and the second light-emitting element. The distance between the optical sensor and the first light-emitting element is less than half of the distance between the first light-emitting element and the second light-emitting element.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

In the disclosure, the technical features of the various embodiments may be replaced or combined with each other to complete other embodiments without being mutually exclusive.

Figure 1:
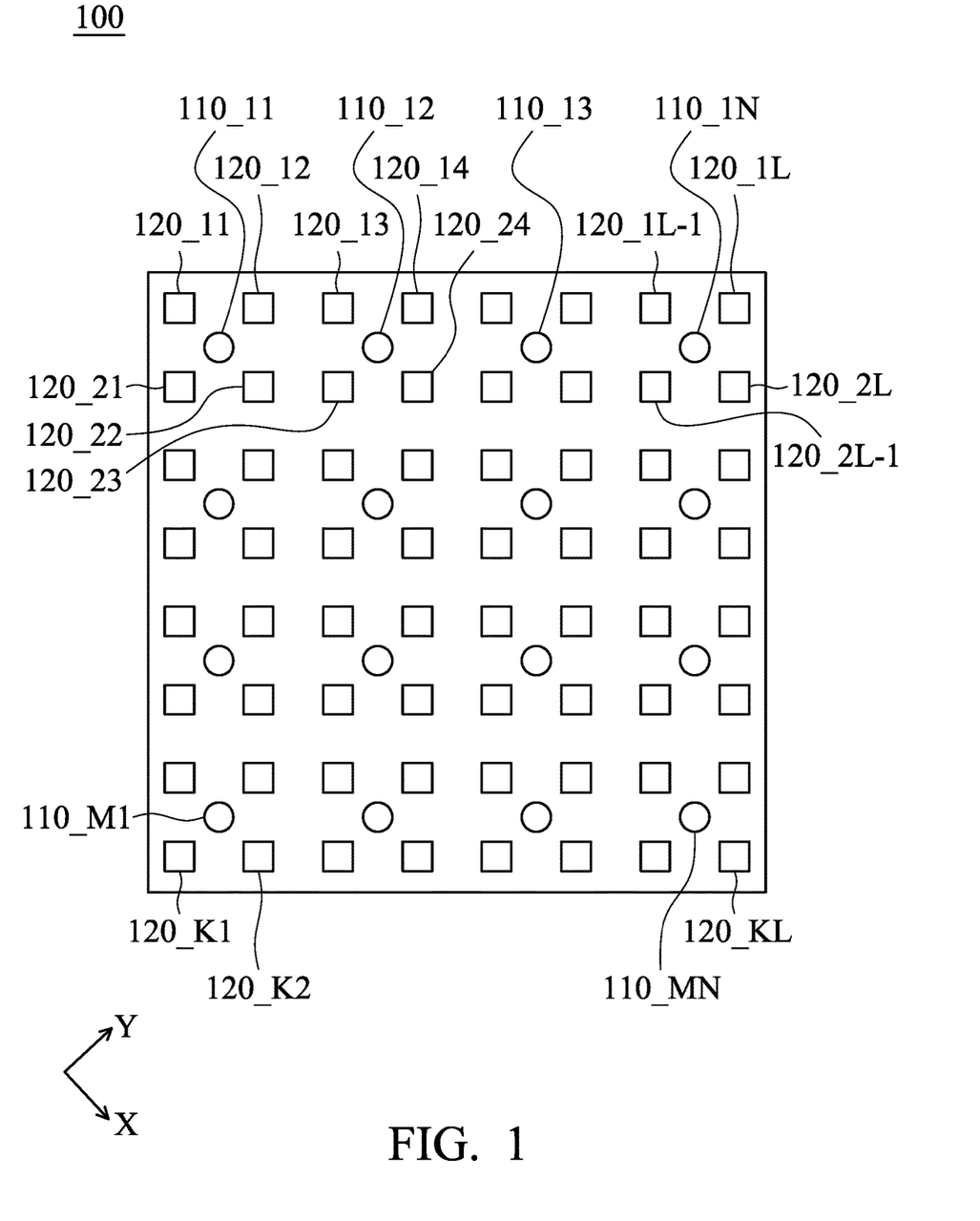
FIG. 1 is a schematic view of an electronic device according to an embodiment of the disclosure.

FIG. 1 is a schematic view of an electronic device according to an embodiment of the disclosure. In some embodiments, the electronic device 100 may include a liquid crystal (LC), an organic light-emitting diode (OLED), a light-emitting diode (LED), a quantum dot (QD), a fluorescence, a phosphor, other suitable materials, or a combination thereof, but the disclosure is not limited thereto. The light-emitting diode may include, for example, a mini light-emitting diode (mini LED), a micro light-emitting diode (micro LED), a quantum dot light-emitting diode (QLED/QDLED). In some embodiments, the electronic device 100 may be a display device, an antenna device, a sensing device, a touch display, a curved display or a free shape display, and may also be a bendable or flexible spliced display device, but the disclosure is not limited thereto. The antenna device may be, for example, a liquid crystal antenna, but the disclosure is not limited thereto. It should be noted that the electronic device may be any combination of the foregoing, but the disclosure is not limited thereto. Furthermore, the appearance of the electronic device may be rectangular, circular, polygonal, a shape with curved edges, or other suitable shapes. The electronic device may include peripheral systems, such as a driving system, a control system, a light source system, a shelf system, etc., to support the display device or the antenna device.

Please refer to FIG. 1. The electronic device 100 may include a plurality of optical sensors 110_11~110_MN and a plurality of light-emitting elements 120_11~120_KL, wherein M, N, K and L are positive integers greater than 1. In the embodiment, K and L are greater than M and N, i.e., a number of light-emitting elements 120_11~120_KL is greater than a number of optical sensors 110_11~110_MN. In some embodiments, M and N may be the same or different, and K and L may be the same or different. In the embodiment, the optical sensor 110_11~110_MN may be made of thin film transistors (TFTs) or other sensors, but the disclosure is not limited thereto. In addition, the optical sensors 110_11~110_MN are used to sense the optical signal generated by the light source device (not shown). The above light source device is, for example, a laser light pen or an infrared light pen, but the disclosure is not limited thereto.

The light-emitting elements 120_11~120_KL may be disposed adjacent to the optical sensors 110_11~110_MN. For example, the light-emitting element 120_11, the light-emitting element 120_12, the light-emitting element 120_21 and the light-emitting element 120_22 may be disposed adjacent to the optical sensor 110_11. That is, for example, there are no other light-emitting elements or optical sensors between the light-emitting element 120_11 and the optical sensor 110_11, and there are no other light-emitting elements or optical sensors between the light-emitting element 120_12 and the optical sensor 110_11. The light-emitting element 120_13, the light-emitting element 120_14, the light-emitting element 120_23 and the light-emitting element 120_24 may be disposed adjacent to the optical sensor 110_12. The light-emitting element 120_1L-1, the light-emitting element 120_1L, the light-emitting element 120_2L-1 and the light-emitting element 120_2L may be disposed adjacent to the optical sensor 110_1N. The manner in which the remaining light-emitting elements and the remaining optical sensors are disposed adjacent to each other may be deduced by analogy from the description of the above embodiment.

In the embodiment, the light-emitting elements 120_11~120_KL may be the organic light-emitting diode, the light-emitting diode (LED), such as the mini light-emitting diode, the micro light-emitting diode, the quantum dot light-emitting diode, etc., but the disclosure is not limited thereto. In addition, the light-emitting elements 120_11~120_KL may be a light-emitting die or a package form including the light-emitting die. Furthermore, the light-emitting elements 120_11~120_KL may generate lights of a single color, such as a white light, or lights of multiple colors, such as a red light, a green light, a blue light, but the disclosure is not limited thereto.

In the embodiment, the user may operate the light source device to generate the optical signal to the electronic device 100. That is, the optical signal is provided to a first optical sensor of the optical sensors 110_11~110_MN of the electronic device 100, such as the optical sensor 110_11. Then, when the light-emitting elements (such as the light-emitting element 120_11, the light-emitting element 120_12, the light-emitting element 120_21 and the light-emitting element 120_22) adjacent to the optical sensor 110_1 are dimmed, the optical sensor 110_1 outputs a driving signal, allowing the electronic device 100 to determine the position of the optical signal. In the embodiment, the light-emitting element is dimmed to decrease the gray level of the light-emitting element, for example, to 50% or less of the original gray level. Furthermore, the gray level of the light-emitting element may be decreased to zero, for example, when the light-emitting element is turned off and does not generate an optical signal.

In some embodiments, the electronic device 100 may further include a plurality of detection periods. The detection periods are periods during which the optical sensors 110_11~110_MN detect and are detected by a processing device (not shown) in the electronic device 100 in order to generate corresponding driving signals. At the same time, the light-emitting elements 120_11~120_KL adjacent to the optical sensors 110_11~110_MN may be dimmed during the corresponding detection periods. For example, when the optical sensor 110_11 detects during the detection period, at least one or all of the light-emitting element 120_11, the light-emitting element 120_12, the light-emitting element 120_21 and the light-emitting element 120_22 may be dimmed during the corresponding detection period. When the optical sensor 110_12 detects during the detection period, at least one or all of the light-emitting element 120_13, the light-emitting element 120_14, the light-emitting element 120_23 and the light-emitting element 120_24 may be dimmed during the corresponding detection period. The operation of the remaining light-emitting elements and the remaining optical sensors may be deduced by analogy from the description of the above embodiment.

In some embodiments, the optical sensors 110_11~110_MN may detect in order, but the disclosure is not limited thereto. For example, the detective order may be the optical sensor 110_11, the optical sensor 110_12, the optical sensor 110_13, . . . . In addition, the detective order may also be the optical sensors 110_11~110_1N, the optical sensors 110_21~110_2N, the optical sensors 110_31~110_3N, . . . .

In some embodiments, the optical sensors 110_11~110_MN may detect in a skippingly order, but the disclosure is not limited thereto. For example, the detective order may be the optical sensor 110_11, the optical sensor 110_13, the optical sensor 110_15, . . . . In addition, the detective order may also be the optical sensors 110_11~110_1N, the optical sensors 110_31~110_3N, the optical sensors 110_51~110_5N, . . . .

In some embodiments, the optical sensors 110_11~110_MN may detect in an irregular order, but the disclosure is not limited thereto. For example, the detective order may be the optical sensor 110_11, the optical sensor 110_23 (not marked), the optical sensor 110_41 (not marked), . . . . In addition, the detective order may also be the optical sensors 110_11~110_1N, the optical sensors 110_51~110_5N (not marked), the optical sensors 110_21~110_2N (not marked).

In some embodiments, all of the optical sensors 110_11~110_MN may detect during a detection period, and generate the corresponding driving signals. At the same time, all of the light-emitting elements 120_11~120_KL are dimmed during the detection period. Therefore, the possibility that the optical sensors 110_11~110_MN will mistakenly determine that the light emitted by the adjacent light-emitting elements 110_11~110_MN is the optical signal generated by the light source device may be effectively decreased, effectively increasing the detection accuracy of the optical sensors 110_11~110_MN.

Figure 2:
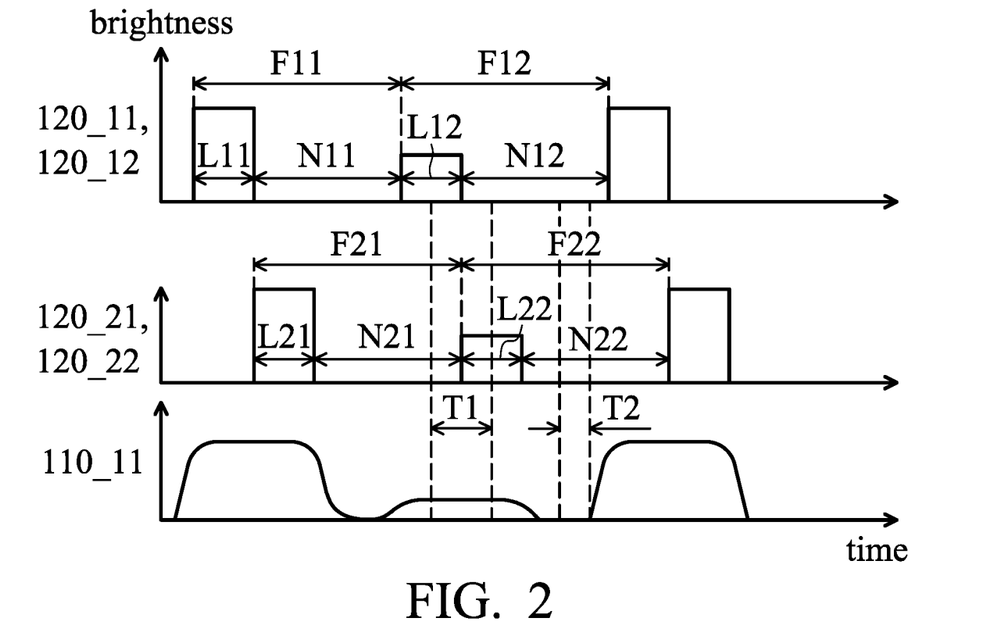
FIG. 2 is an operation timing diagram of an optical sensor and light-emitting elements of an electronic device according to an embodiment of the disclosure.

FIG. 2 is an operation timing diagram of an optical sensor and light-emitting elements of an electronic device according to an embodiment of the disclosure. For the convenience of description, the electronic device 100 including the optical sensor 110_11, the light-emitting element 120_11, the light-emitting element 120_12, the light-emitting element 120_21 and the light-emitting element 120_22 is taken as an example. The electronic device 100 may include, for example, a frame period F11, a frame period F12, a frame period F21 and a frame period F22 during a display period. The frame period F11 may include a light-emitting period L11 and a non-light-emitting period N11 of the light-emitting element 120_11 or the light-emitting element 120_12. In an embodiment of the disclosure, the non-light-emitting period N11 may include a blanking period. In other words, for example, before the frame period F11 enters the frame period F12, the light-emitting element 120_11 or the light-emitting element 120_12 may not receive a gate signal generated by the electronic device 100 for a period, and this period that the gate signal is not received is called the blanking period. The frame period F12 follows the frame period F11, and the frame period F12 may include a light-emitting period L12 and a non-light-emitting period N12 of the light-emitting element 120_11 or the light-emitting element 120_12. In an embodiment of the disclosure, the non-light-emitting period N12 may include the blanking period.

The frame period F21 follows the light-emitting period L11 of the light-emitting element 120_11 or the light-emitting element 120_12, and the frame period F21 may include a light-emitting period L21 and a non-light-emitting period N21 of the light-emitting element 120_21 or the light-emitting element 120_22. In an embodiment of the disclosure, the non-light-emitting period N21 may include the blanking period. The frame period F22 follows the frame period F21, and the frame period F22 may include a light-emitting period L22 and a non-light-emitting period N22 of the light-emitting element 120_21 or the light-emitting element 120_22. In an embodiment of the disclosure, the non-light-emitting period N12 may include the blanking period.

During the light-emitting period L11 of the frame period F11, the light-emitting element 120_11 and the light-emitting element 120_12 may be turned on and emit a light. Then, during the light-emitting period L21 of the frame period F21, the light-emitting element 120_21 and the light-emitting element 120_22 may be turned on and emit a light. At this time, the optical sensor 110_11 may sense the optical signals generated by the light-emitting element 120_11, the light-emitting element 120_12, the light-emitting element 120_21 and the light-emitting element 120_22 and generate a driving signal. However, during the frame period F11 and the frame period F21, the driving signal has not yet been detected by the processing device.

During the light-emitting period L12 of the frame period F12, the light-emitting element 120_11 and the light-emitting element 120_12 are dimmed or turned off, i.e., the brightness of the light-emitting element 120_11 and the light-emitting element 120_12 is decreased. For example, the brightness of the light-emitting element 120_11 and the light-emitting element 120_12 is decreased to 50% or less of the original brightness (or the gray level value). Then, during the light-emitting period L22 of the frame period F22, the light-emitting element 120_21 and the light-emitting element 120_22 are dimmed or turned off. In an overlap period of the light-emitting period L12 and the light-emitting period L22, i.e., a detection period T1, the optical sensor 110_11 may sense the optical signal generated by the light source device and generate the corresponding driving signal accordingly. The driving signal generated by the optical sensor 110_11 may be transmitted, for example, to the processing device of the electronic device 100, allowing the processing device to determine the position of the optical signal and perform the corresponding process.

In FIG. 2, the detection period T1 is between one-half of the light-emitting period L12 and one-half of the light-emitting period L22, but the disclosure is not limited thereto. In another embodiment, the detection period T1 may be between the starting position of the light-emitting period L12 and the ending position of the light-emitting period L22.

During the non-light-emitting period N12 of the frame period F12, i.e., the blanking period of the light-emitting element 120_11 and the light-emitting element 120_12, the light-emitting element 120_11 and the light-emitting element 120_12 do not emit the light. Then, during the non-light-emitting period N22 of the frame period F22, i.e., the blanking period of the light-emitting element 120_21 and the light-emitting element 120_22, the light-emitting element 120_21 and the light-emitting element 120_22 do not emit the light. In an overlap period of the non-light-emitting period N12 and the non-light-emitting period N22 (such as an overlap period of the blanking period of the light-emitting element 120_11 and the light-emitting element 120_12 and the blanking period of the light-emitting element 120_21 and the light-emitting element 120_22), i.e., a detection period T2, the optical sensor 110_11 may sense the optical signal generated by the light source device and generate the corresponding driving signal accordingly. The driving signal generated by the optical sensor 110_11 may be transmitted, for example, to the processing device of the electronic device 100, allowing the processing device to determine the position of the optical signal and perform the corresponding process. The operation of the remaining optical sensors 110_12~110_MN may be deduced by analogy from the operation of the above optical sensor 110_11, and the description thereof is not repeated herein.

Therefore, during the light-emitting period of the frame period in which the light-emitting elements are dimmed (for example, the overlap period of the light-emitting period L12 in which the light-emitting element 120_11 or the light-emitting element 120_12 is dimmed and the light-emitting period L22 in which the light-emitting element 120_21 or the light-emitting element 120_22 is dimmed) or the non-light-emitting period of the light-emitting elements (for example, the overlap period of the non-light-emitting period N12 of the light-emitting element 120_11 or the light-emitting element 120_12 and the non-light-emitting period N22 of the light-emitting element 120_21 or the light-emitting element 120_22), the optical sensor 110_11 may sense the optical signal generated by the light source device, so as to effectively decrease the possibility of noise misjudgment or increase the detection accuracy of the optical sensor 110_11.

In addition, in some embodiments, in cases where the display frame of the electronic device 100 includes the frame with brightest and darkest (such as displaying a fireworks frame), when the optical signal generated by the light source device appears in the darkest position, the optical sensor may immediately sense the optical signal generated by the light source device to generate the corresponding driving signal. When the optical signal generated by the light source device appears in the brightest position, the optical sensor may use the above method to sense, so as to generate the corresponding driving signal. For example, the light-emitting element is dimmed, the optical sensor may sense the brightness of the optical signal generated by the light source device to generate the corresponding driving signal.

Figure 3:
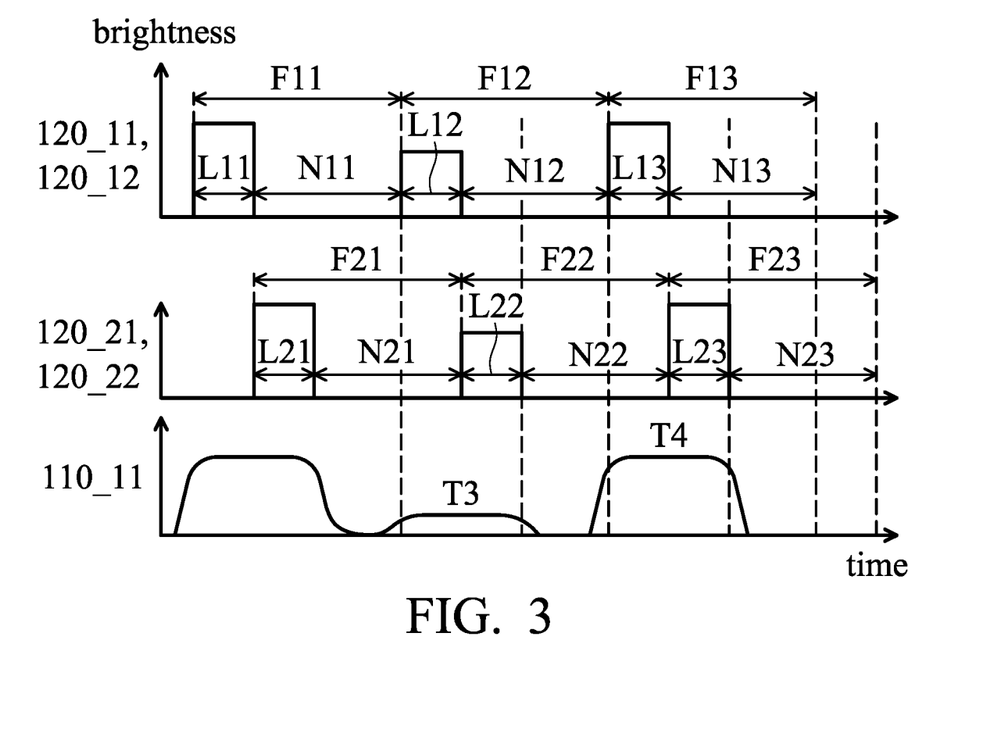
FIG. 3 is an operation timing diagram of an optical sensor and light-emitting elements of an electronic device according to an embodiment of the disclosure.

FIG. 3 is an operation timing diagram of an optical sensor and light-emitting elements of an electronic device according to another embodiment of the disclosure. Please refer to FIG. 1 and FIG. 3. The electronic device 100 of the embodiment is the same as the above embodiment, and the description thereof is not repeated herein. For the convenience of description, the electronic device 100 including the optical sensor 110_11, the light-emitting element 120_11, the light-emitting element 120_12, the light-emitting element 120_21 and the light-emitting element 120_22 is taken as an example. The operation of the remaining optical sensors 110_12~110_MN may be deduced by analogy from the operation of the above optical sensor 110_11, and the description thereof is not repeated herein. The electronic device 100 includes, for example, a frame period F11, a frame period F12, a frame period F21 and a frame period F22 during the display period. The frame period F11 may include light-emitting periods L11 and non-light-emitting periods N11 of a plurality of light-emitting elements, for example, a light-emitting period L11 and a non-light-emitting period N11 of the light-emitting element 120_11 or the light-emitting element 120_12. The frame period F12 follows the frame period F11, and the frame period F12 may include light-emitting periods L12 and non-light-emitting periods N12 of the light-emitting elements.

The frame period F21 may include light-emitting periods L21 and non-light-emitting periods N21 of the light-emitting elements, for example, a light-emitting period L21 a non-light-emitting period N21 of the light-emitting element 120_21 or the light-emitting element 120_22. The frame period F22 follows the frame period F21, and the frame period F22 may include light-emitting periods L22 and non-light-emitting periods N22 of the light-emitting elements. In the embodiment, F11, F12, F21 and F22 are, for example, the frame periods of the electronic device 100 in the display stage.

In the embodiment, the light-emitting element 120_11, the light-emitting element 120_12, the light-emitting element 120_21 and the light-emitting element 120_22 normally perform the function of the electronic device 100 during the frame periods F11 and F21, respectively. This function may be, for example, displaying dynamic or static frames. During the next frame period F12 and the frame period F22, the brightness of the light-emitting period L12 and the light-emitting period L22 is decreased. At this time, the light-emitting period L12 and the light-emitting period L22 are added to form a detection period T3. The processing device of the electronic device 100 may receive the driving signal generated by the optical sensor 110_11 during the detection period T3 and perform the corresponding process. For example, the processing device determines the coordinates of the position of the electronic device 100 that is touched by the finger using the detected driving signal.

In the embodiment, the brightness may also be transformed into a corresponding gray level value to indicate that the gray level value is high or the brightness is high. For example, when the electronic device 100 is performing a function normally, the highest brightness appears, for example, to be gray level 255. When the processing device receives the driving signal during the detection period T3, the electronic device 100 sends a signal, such as a pulsed signal, to the light-emitting element 120_11, the light-emitting element 120_12, the light-emitting element 120_21 and the light-emitting element 120_22. The light-emitting element 120_11, the light-emitting element 120_12, the light-emitting element 120_21 and the light-emitting element 120_22 generate a lower gray level during the corresponding light-emitting periods L12 and L22. For example, the light-emitting brightness with the highest brightness of the gray level 255 is taken as an example, the light-emitting elements are adjusted to a relatively lower brightness of the gray level 190, the noise signal received by the processing device from the driving signal not generated by the optical sensor 110_11 may be decreased, so as to improve the signal-to-noise ratio (SNR) or increase the detection accuracy of the processing device.

In the embodiment, the pulsed signal refers to a periodic signal, but the time axis of the previous signal and the next signal is not continuous. The type of the pulsed signal is not limited. For example, the pulsed signal may be a rectangular pulse, a square wave pulse, a triangular pulse or other suitable pulse signals. It should be noted that decreasing the brightness of light-emitting period L12 and light-emitting period L22 and receiving the driving signal generated by the optical sensor 110_11 during the detection period T3 is an example of the disclosure.

In another embodiment, the brightness of the light-emitting element 120_11, the light-emitting element 120_12, the light-emitting element 120_21 and the light-emitting element 120_22 may be increased during the detection period, so that the processing device of the electronic device 100 receives the driving signal generated by the optical sensor 110_11. For example, referring to FIG. 3, the frame period F13 and the frame period F23 are the period that the electronic device 100 normally performs the function. When the processing device starts to detect, the electronic device 100 sends a signal, such as a pulsed signal, such that the brightness of the light-emitting element 120_11, the light-emitting element 120_12, the light-emitting element 120_21 and the light-emitting element 120_22 during the corresponding light-emitting period L13 and light-emitting period L23 is higher than the brightness of the light-emitting element 120_11, the light-emitting element 120_12, the light-emitting element 120_21 and the light-emitting element 120_22 during the previous frame period F12. At this time, the added time of the light-emitting period L13 and the light-emitting period L23 may be a detection period T4, and the processing device may receive the driving signal generated by the optical sensor 110_11 during the detection period T4 and perform the corresponding process.

Therefore, the brightness of the light-emitting elements during the detection period is changed, such that the optical sensor 110_11 may be detected by the processing device during the light-emitting period of the frame period of the electronic device 100, so as to effectively decrease the possibility of noise misjudgment or increase the detection accuracy of the processing device. As for the details and steps of the detection may be described in the subsequent embodiments.

Figure 4:
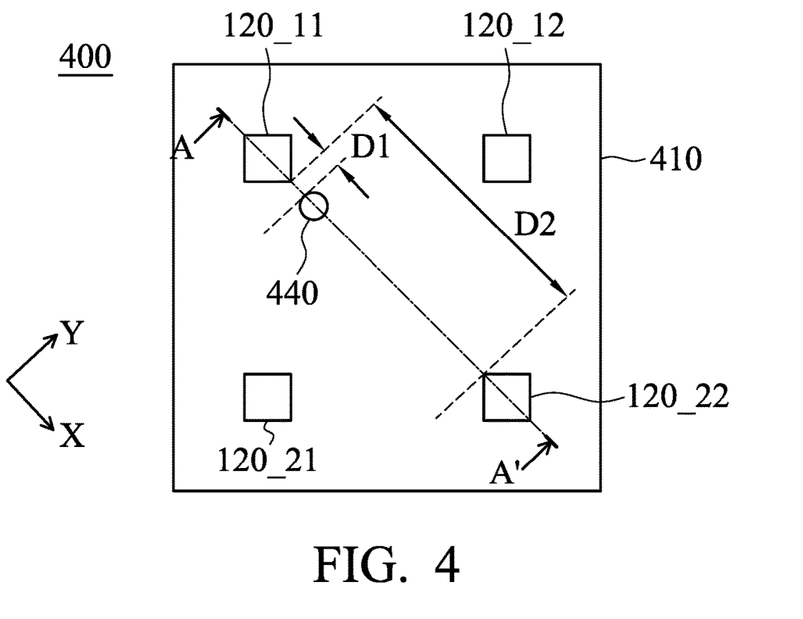
FIG. 4 is a schematic view of an electronic device according to another embodiment of the disclosure.
Figure 5:
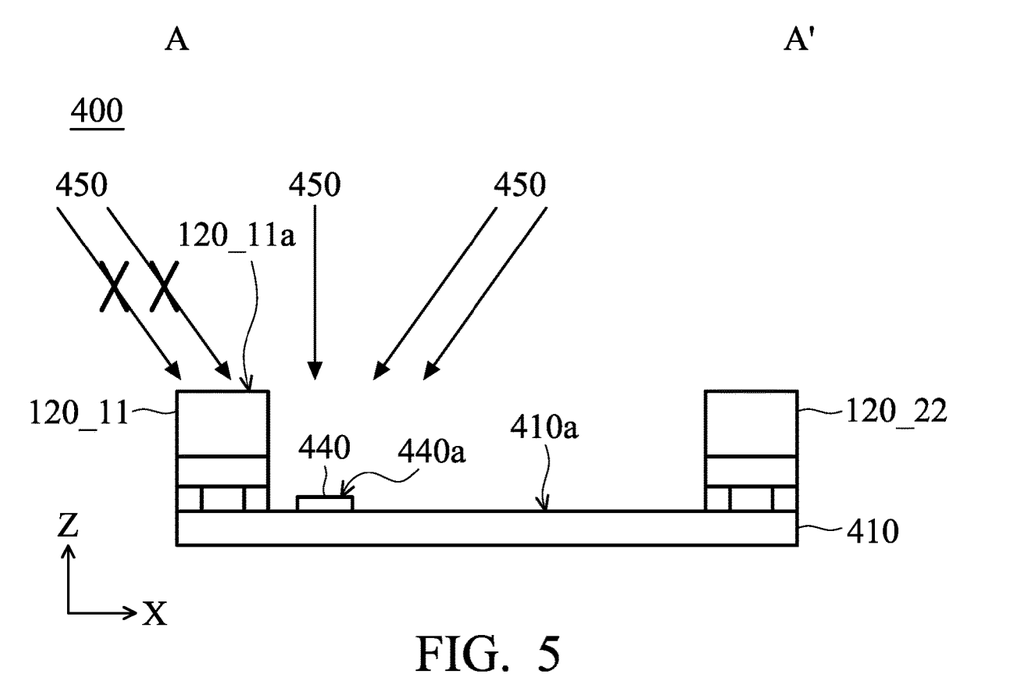
FIG. 5 is a cross-sectional view of the electronic device in FIG. 4 taken along a line A-A'.

FIG. 4 is a schematic view of an electronic device according to another embodiment of the disclosure. FIG. 5 is a cross-sectional view of the electronic device in FIG. 4 taken along a line A-A'. Please refer to FIG. 4 and FIG. 5. The electronic device 400 may include a plurality of light-emitting element and a plurality of optical sensors, as shown in the electronic device 100. It is worth noting that, for the convenience of description, FIG. 4 shows a part of the situation of the electronic device. Please refer to FIG. 4. The electronic device 400 at least includes a substrate 410, a light-emitting element 120_11, a light-emitting element 120_12, a light-emitting element 120_21, a light-emitting element 120_22 and an optical sensor 440. In an embodiment, the electronic device 400 may be a display device, but the disclosure is not limited thereto. In addition, the light-emitting element 120_11, the light-emitting element 120_12, the light-emitting element 120_21, the light-emitting element 120_22 and the optical sensor 440 shown in FIG. 4 and FIG. 5 are an exemplary embodiment of the disclosure, but not used to limit the number or shape of light-emitting elements and optical sensor of the disclosure. The user may adjust the number or shape of the light-emitting elements and optical sensor according to the requirements thereof. The disposing of the light-emitting elements and the optical sensor may not necessarily follow the disposing manner shown in FIG. 4. The light-emitting element 120_11 and the light-emitting element 120_21 may be alternatively disposed on the Y direction or other suitable design manners, as long as the effect of the disclosure may be achieved.

In the embodiment, the substrate 410 may be a rigid substrate or a flexible substrate. The material of the substrate includes, for example, glass, quartz, sapphire, polyimide (PI), polycarbonate (PC) or polyethylene terephthalate (PET) or a combination thereof but the disclosure is not limited thereto. The light-emitting element 120_11, the light-emitting element 120_12, the light-emitting element 120_21 and the light-emitting element 120_22 are disposed on the substrate 410, and the light-emitting element 120_11 is adjacent to the light-emitting element 120_22. In the embodiment, the light-emitting element 120_11, the light-emitting element 120_12, the light-emitting element 120_21 and the light-emitting element 120_22 may be the OLED, the LED, such as the mini LED, the micro LED, the QLED/QD-LED etc., but the disclosure is not limited thereto.

The optical sensor 440 is disposed on the substrate 410 and adjacent to the light-emitting element 120_11 and the light-emitting element 120_22. In the embodiment, the distance D1 between the optical sensor 440 and the light-emitting element 120_11 is less than half of the distance D2 between the light-emitting element 120_11 and the light-emitting element 120_22. That is, the optical sensor 440 is disposed adjacent to the light-emitting element 120_11 and far away from the light-emitting element 120_22. In addition, the distance D1 and the distance D2 are, for example, the shortest distances between two objects in a top view direction of the electronic device 400, such as the X-Y plane. The disposing position of the optical sensor 440 shown in FIG. 5 is an exemplary embodiment of the disclosure, but the disclosure is not limited thereto. The user may adjust the disposing position of the optical sensor 440 according to the requirements thereof. The distance D1 between the optical sensor 440 and the light-emitting element 120_11 is still less than half of the distance D2 between the light-emitting element 120_11 and the light-emitting element 120_22, and the same technical effect may be achieved.

In some embodiments, since the optical sensor 440 is adjacent to the light-emitting element 120_11 and the height of the light-emitting element 120_11 is higher than the height of the optical sensor 440, the light-emitting element 120_11 may be used to shield at least some of the noise light 450 coming toward the optical sensor 440, as indicated by the "X" marked in FIG. 5. The height referred to in the disclosure may, for example, be the distance between the surface 410a of the substrate 410 closest to the light-emitting element 120_11 and the top surface 120_11a of the light-emitting element 120_11. Similarly, the height of the optical sensor 440 refers to the distance from the surface 410a to the top surface 440a of the optical sensor 440. The noise light 450 of the embodiment may be an ambient light or a light that is not sensed by the optical sensor 440. Therefore, the optical sensor 440 may be shielded from the interference of the noise light 450, improving the signal-to-noise ratio of the optical sensor 440 or increasing the sensing accuracy of the optical sensor 440.

In some embodiments, in a normal direction of the substrate 410, such as a Z direction, the optical sensor 440 may partially overlap the light-emitting element 120_11. That is, a part of the optical sensor 440 is disposed below the light-emitting element 120_11, and another part of the optical sensor 440 is exposed outside the light-emitting element 120_11. The term "below" in this embodiment indicates that when viewed from the Z direction, the light-emitting element 120_11 and the optical sensor 440 overlap completely or partially. When the overlap range of the light-emitting element 120_11 and the optical sensor 440 in the Z direction is larger, the light-emitting element 120_11 may decrease more noise light 450 toward the optical sensor 440. Therefore, the optical sensor 440 may decrease the influences from the noise light 450, so as to improve the signal-to-noise ratio of the optical sensor 440 or increase the detection accuracy of the optical sensor 440.

Figure 6:
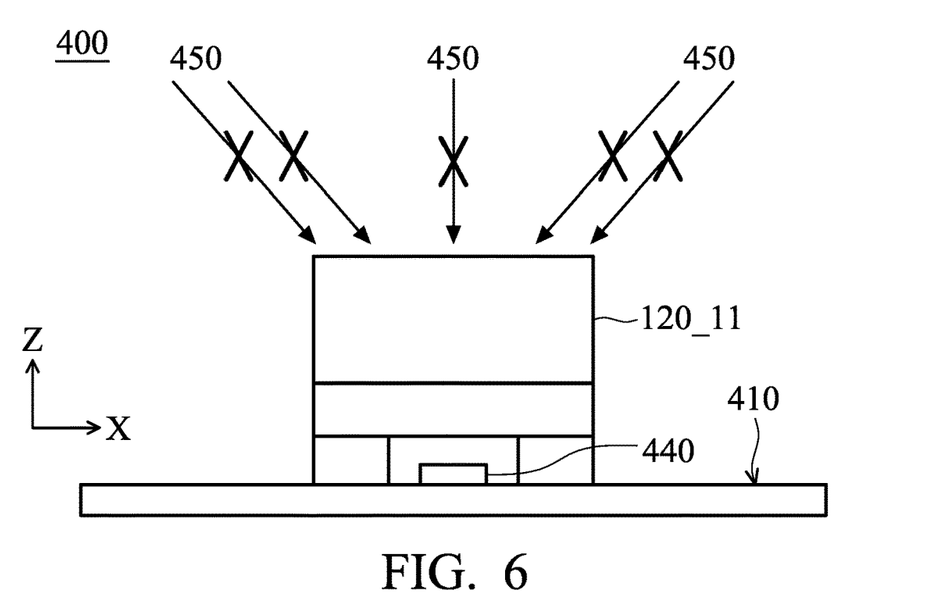
FIG. 6 is a partial cross-sectional view of the electronic device in FIG. 4 taken along line A-A'.

The embodiment shown in FIG. 6 takes the optical sensor 440 directly below the light-emitting element 120_11 as an example. When the light-emitting element 120_11 and the optical sensor 440 completely overlap in the Z direction, the light-emitting element 120_11 may shield more noise light 450, as "X" marked in FIG. 6. Therefore, the optical sensor 440 may decrease the influences from the noise light 450, so as to improve the signal-to-noise ratio of the optical sensor 440 or increase the detection accuracy of the optical sensor 440. Next, the details and steps of the detection of the disclosure will be described.

Figure 7:
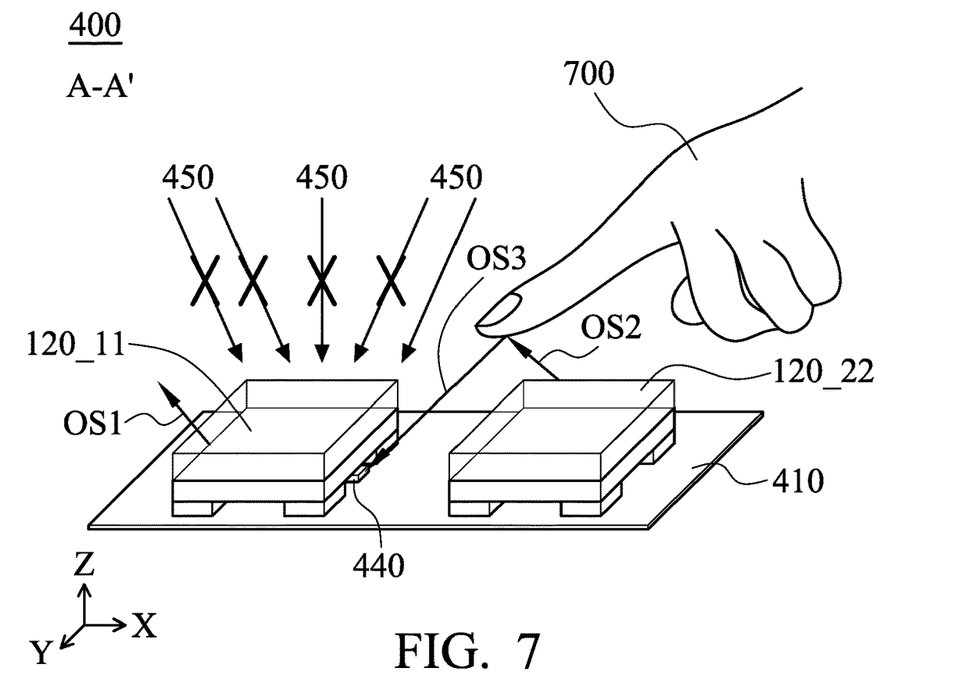
FIG. 7 is a stereogram of the electronic device in FIG. 4 along line A-A'.

FIG. 7 is a stereogram of the embodiment in FIG. 4. Please refer to FIG. 7 and FIG. 4. The electronic device 400 may include a plurality of light-emitting elements, such as a light-emitting element 120_11, a light-emitting element 120_12, a light-emitting element 120_21 and a light-emitting element 120_22. Please refer to FIG. 3. The light-emitting elements may generate optical signals during the frame period F11, such as an optical signal OS1 marked in FIG. 7, and the optical signal OS1 has a corresponding first gray level. In addition, the light-emitting elements may also generate an optical signal OS2 during the frame period F12, and the optical signal OS2 has a corresponding second gray level. In an embodiment, the optical signal OS1 may represent the optical signal emitted by the light-emitting elements during the display period. The optical signal OS2 may represent the optical signal emitted by the light-emitting elements during the detection period. At this time, the optical signal OS2 may be, for example, a pulsed optical signal.

Please refer to FIG. 7. In the overall operation, the light-emitting elements may generate the optical signal OS2 during the detection period. The user may use an object 700 to touch the electronic device 400, such that the object 700 may reflect the optical signal OS2 generated by the light-emitting elements far away from the optical sensor 440, such as the light-emitting element 120_22, to generate an optical signal OS3 (regarded as a reflected optical signal). In the embodiment, the above object 700 may be a finger or a stylus, but the disclosure is not limited thereto, as long as the effect of the disclosure may be achieved.

Then, the optical sensor 440 may sense the optical signal OS3, and output the driving signal during the detection period of the processing device according to the optical signal OS3. Therefore, since the noise light 450 may be partially or completely shielded by the light-emitting elements of the optical sensor 440, such that the light-emitting element, the optical sensor 440 may decrease the interference from the noise light 450, so as to improve the signal-to-noise ratio of the optical sensor 440 or increase the detection accuracy of the optical sensor 440.

In more detail, since the optical sensor 440 is used to sense the optical signal OS3 generated by the object 700 reflecting the optical signal OS2, in order to decrease the influence of the optical sensor 440 on the noise light 450, the gray level values of the light-emitting elements adjacent to the optical sensor 440 may be changed, i.e., the light brightness of the light-emitting elements are changed. For example, when the function of the electronic device 400 is performed normally, the light-emitting elements emit the optical signal OS1, and the optical signal OS1 has a first gray level. During the detection period, the light-emitting elements emit the optical signal OS2, and the optical signal OS2 has a second gray level, wherein the second gray level and the first gray level are different.

In an embodiment, if the first gray level is the highest gray level, taking gray levels 0 to 255 as an example, for example, the gray level 255, and the value of the second gray level may be lower the value of the first gray level, for example, the second gray level is the gray level 190. In another embodiment, if the first gray level is in a state of a lower gray level, for example, the gray level 62, the value of the second gray level may be higher than the value of the first gray level, for example, the second gray level is the gray level 255. The object 700 may reflect the optical signal OS2 and generate the optical signal OS3. The optical sensor adjacent to these light-emitting elements, such as the optical sensor 440 of the optical sensors, outputs the driving signal according to the optical signal OS3. This driving signal may be received, for example, by the processing device of the electronic device 400, such that the processing device may determine the position of the optical signal and perform the corresponding process.

Figure 8:
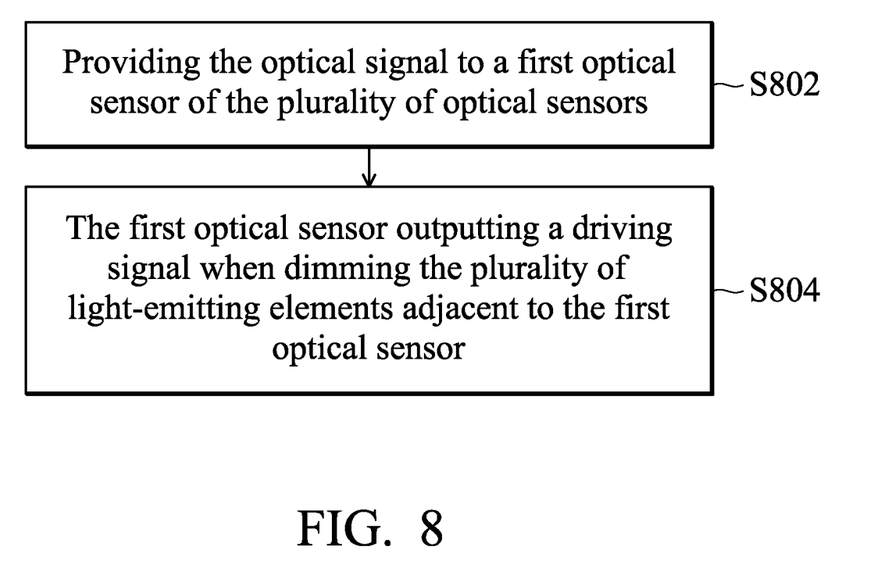
FIG. 8 is a flowchart of an operation method of an electronic device for sensing an optical signal according to an embodiment of the disclosure.

FIG. 8 is a flowchart of an operation method of an electronic device for sensing an optical signal according to an embodiment of the disclosure. For example, FIG. 8 corresponds to FIG. 1 to FIG. 2. In the embodiment, the electronic device includes a plurality of optical sensors and a plurality of light-emitting elements disposed adjacent to the plurality of optical sensors. In step S802, the method involves providing the optical signal to a first optical sensor of the plurality of optical sensors. In step S804, the method involves the first optical sensor outputting a driving signal when dimming the plurality of light-emitting elements adjacent to the first optical sensor. In some embodiments, different optical sensors detect during different detection periods, and the light-emitting elements adjacent to the optical sensors are dimmed during the corresponding detection periods. In some embodiments, all the plurality of optical sensors detect during a detection period, and all the plurality of light-emitting elements are dimmed during the detection period.

Figure 9:
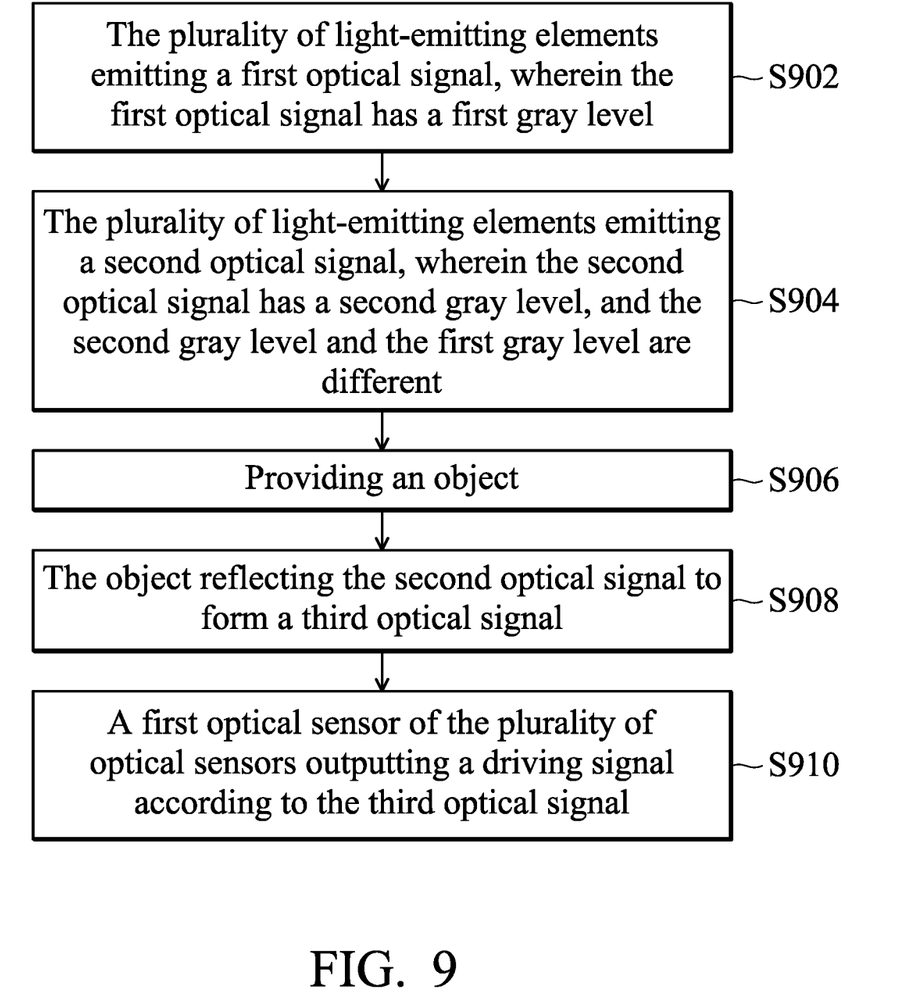
FIG. 9 is a flowchart of an operation method of an electronic device for sensing an optical signal according to an embodiment of the disclosure.

FIG. 9 is a flowchart of an operation method of an electronic device for sensing an optical signal according to an embodiment of the disclosure. For example, FIG. 9 corresponds to FIG. 3 to FIG. 7. In the embodiment, the electronic device includes a plurality of optical sensors and a plurality of light-emitting elements disposed adjacent to the plurality of optical sensors. In step S902, the method involves the plurality of light-emitting elements emitting a first optical signal, wherein the first optical signal has a first gray level. In step S904, the method involves the plurality of light-emitting elements emitting a second optical signal, wherein the second optical signal has a second gray level, and the second gray level and the first gray level are different. In step S906, the method involves providing an object. In step S908, the method involves the object reflecting the second optical signal to form a third optical signal. In step S910, the method involves a first optical sensor of the plurality of optical sensors outputting a driving signal according to the third optical signal. In some embodiments, the processing device performs the detection during a period when the plurality of light-emitting elements emit the second optical signal.

In summary, according to the operation method of the electronic device for sensing the optical signal and the electronic device in the embodiments of the disclosure, the optical signal is provided to the first optical sensor of the optical sensors, and when the light-emitting elements adjacent to the first optical sensor are dimmed, the first optical sensor of the optical sensors outputs the driving signal. Therefore, the possibility that the optical sensors mistakenly determine the light emitted by the adjacent light-emitting elements as the optical signal generated by the light source device may be decreased, so as to increase the detection accuracy of the optical sensors. In addition, the disclosure further sets the distance between the optical sensor and the first light-emitting element being less than half of the distance between the first light-emitting element and the second light-emitting element, and the optical sensor senses the third optical signal generated by the object reflecting the second optical signal generated by the light-emitting element, so as to output the driving signal. Therefore, the optical sensor may be shielded from the interference of the noise light, improving the signal-to-noise ratio of the optical sensor or increasing the sensing accuracy of the optical sensor.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. An operation method for sensing an optical signal, comprising:
   providing an electronic device, wherein the electronic device comprises a plurality of optical sensors and a plurality of light-emitting elements;
   the plurality of light-emitting elements emitting a first optical signal, wherein the first optical signal has a first gray level;
   the plurality of light-emitting elements emitting a second optical signal, wherein the second optical signal has a second gray level, and the second gray level and the first gray level are different;
   providing an object, wherein the object reflects the second optical signal to form a third optical signal; and
   a first optical sensor of the plurality of optical sensors outputting a driving signal according to the third optical signal;
   wherein during the detection period, the plurality of light-emitting elements are dimmed, and the first optical signal with the first gray level is adjusted to the second optical signal with the second gray level.

2. The operation method for sensing the optical signal according to claim 1,
   wherein the second gray level is lower than the first gray level when the first gray level is a highest gray level of the electronic device.

3. The operation method for sensing the optical signal according to claim 1, wherein the second optical signal is a pulsed optical signal.

4. The operation method for sensing the optical signal according to claim 1, wherein the first optical sensor is adjacent to a first light-emitting element and a second light-emitting element of the plurality of light emitting elements.

5. The operation method for sensing the optical signal according to claim 4, wherein a distance between the first optical sensor and the first light-emitting element is less than half of a distance between the first light-emitting element and the second light-emitting element.

6. The operation method for sensing the optical signal according to claim 4, wherein a height of the first light-emitting element is higher than a height of the first optical sensor.

7. The operation method for sensing the optical signal according to claim 4, wherein the first optical sensor is disposed below the first light-emitting element.

8. The operation method for sensing the optical signal according to claim 1, wherein the first optical signal is an optical signal emitted by the plurality of light-emitting elements during a display period, and the second optical signal is an optical signal emitted by the plurality of light-emitting elements during a detection period.

9. An electronic device, comprising:
   a substrate;
   a first light-emitting element, disposed on the substrate;
   a second light-emitting element, disposed on the substrate, wherein the first light-emitting element is adjacent to the second light-emitting element; and
   an optical sensor, disposed on the substrate, wherein the optical sensor is adjacent to the first light-emitting element and the second light-emitting element;
   wherein a distance between the optical sensor and the first light-emitting element is less than half of a distance between the first light-emitting element and the second light-emitting element;
   wherein the first light-emitting element and the second light-emitting element emit a first optical signal, and the first optical signal has a first gray level;
   wherein the first light-emitting element and the second light-emitting element emit a second optical signal, the second optical signal has a second gray level, and the second gray level and the first gray level are different;
   wherein during the detection period, the first light-emitting element and the second light-emitting element are dimmed, and the first optical signal with the first gray level is adjusted to the second optical signal with the second gray level.

10. The electronic device according to claim 9, wherein a height of the first light-emitting element is higher than a height of the optical sensor.

11. The electronic device according to claim 9, wherein the second optical signal is a pulsed optical signal.

12. The electronic device according to claim 9, wherein the second gray level is lower than the first gray level when the first gray level is a highest gray level of the electronic device.

13. The electronic device according to claim 9, wherein the first optical signal is emitted by the first light-emitting element during a display period, and the second optical signal is emitted by the second light-emitting element during a detection period.

14. The electronic device according to claim 9, wherein the optical sensor outputs a driving signal according to a third optical signal generated by an object reflecting the second optical signal.

15. The electronic device according to claim 9, wherein the optical sensor is disposed below the first light-emitting element.

* * * * *